US008222085B2

(12) United States Patent
Fryklund et al.

(10) Patent No.: US 8,222,085 B2
(45) Date of Patent: *Jul. 17, 2012

(54) NEAR CHIP SCALE SEMICONDUCTOR PACKAGES

(75) Inventors: David J Fryklund, Hampton Falls, NH (US); Alfred H Carl, Nashua, NH (US); Brian P Murphy, Revere, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/189,658

(22) Filed: Jul. 25, 2011

(65) Prior Publication Data

US 2011/0281400 A1    Nov. 17, 2011

Related U.S. Application Data

(62) Division of application No. 12/872,583, filed on Aug. 31, 2010, now Pat. No. 8,022,557, which is a division of application No. 11/924,233, filed on Oct. 25, 2007, now Pat. No. 7,824,965, application No. 13/189,658, which is a division of application No. 12/887,747, filed on Sep. 22, 2010, now Pat. No. 8,105,879, which is a division of application No. 11/924,233, filed on Oct. 25, 2007, now Pat. No. 7,824,965.

(60) Provisional application No. 60/954,483, filed on Aug. 7, 2007.

(51) Int. Cl.
*H01L 21/00* (2006.01)
(52) U.S. Cl. .......... 438/114; 257/E21.502; 257/E21.116
(58) Field of Classification Search .................. 438/114; 257/E21.502, E23.116
See application file for complete search history.

(56) References Cited

U.S. PATENT DOCUMENTS

| | | |
|---|---|---|
| 4,710,798 A | 12/1987 | Marcantonio |
| 4,918,811 A | 4/1990 | Eichelberger et al. |
| 5,019,997 A | 5/1991 | Haller |
| 5,049,978 A | 9/1991 | Bates et al. |
| 5,359,496 A | 10/1994 | Kornrumpf et al. |
| 5,637,916 A | 6/1997 | Joshi |
| 5,841,193 A | 11/1998 | Eichelberger |
| 5,990,553 A | 11/1999 | Morita et al. |
| 6,159,767 A | 12/2000 | Eichelberger |
| 6,239,482 B1 | 5/2001 | Fillion et al. |
| 6,388,335 B1 | 5/2002 | Lam |
| 6,396,148 B1 | 5/2002 | Eichelberger et al. |
| 6,426,545 B1 | 7/2002 | Eichelberger et al. |

(Continued)

FOREIGN PATENT DOCUMENTS

JP    08148620 A    6/1996

*Primary Examiner* — Jarrett Stark
*Assistant Examiner* — John M Parker
(74) *Attorney, Agent, or Firm* — Lando & Anastasi, LLP

(57) ABSTRACT

Flip chip ball grid array semiconductor devices and methods for fabricating the same. In one example, a near chip scale method of semiconductor die packaging may comprise adhering the die to a substrate in a flip chip configuration, coating the die with a first polymer layer, selectively removing the first polymer layer to provide at least one opening to expose a portion of the die, and depositing a first metal layer over the first polymer layer, the first metal layer at least partially filling the at least one opening to provide an electrical contact to the die, and including a portion that substantially surrounds the die in a plane of an upper surface of the first metal layer to provide an electromagnetic shield around the die.

12 Claims, 16 Drawing Sheets

U.S. PATENT DOCUMENTS

| | | |
|---|---|---|
| 6,555,908 B1 | 4/2003 | Eichelberger et al. |
| 6,818,544 B2 | 11/2004 | Eichelberger et al. |
| 6,856,007 B2 | 2/2005 | Warner |
| 7,160,756 B2 | 1/2007 | Kripesh et al. |
| 7,553,699 B2 | 6/2009 | Lee |
| 7,619,901 B2 | 11/2009 | Eichelberger et al. |
| 2005/0158009 A1 | 7/2005 | Eichelberger et al. |

NEAR CHIP SCALE SEMICONDUCTOR PACKAGES

RELATED APPLICATIONS

This application is a divisional of and claims the benefit under 35 U.S.C. §§120 and 121 to U.S. application Ser. Nos. 12/872,583 filed Aug. 31, 2010 entitled NEAR CHIP SCALE SEMICONDUCTOR PACKAGES and 12/887,747 filed Sep. 22, 2010 entitled NEAR CHIP SCALE PACKAGE INTEGRATION PROCESS, each which is a divisional of and claims the benefit under 35 U.S.C. §§120 and 121 to U.S. application Ser. No. 11/924,233 filed Oct. 25, 2007 entitled "NEAR CHIP SCALE PACKAGE INTEGRATION PROCESS," and now U.S. Pat. No. 7,824,965 which claims priority under 35 U.S.C. §119(e) to U.S. Provisional Patent Application No. 60/954,483 filed Aug. 7, 2007, entitled "NEAR CHIP SCALE PACKAGE INTEGRATION PROCESS," all of which are herein incorporated by reference in their entireties.

BACKGROUND

1. Field of Invention

The present invention relates to semiconductor device packages and methods for fabricating the same. More particularly, at least one embodiment is directed to a flip chip semiconductor device package and packaging method.

2. Discussion of Related Art

Presently, there are several semiconductor packaging techniques that are well received in the radio frequency (RF) component industry. However, these packaging techniques are relatively complex and make meeting cost and operational requirements difficult, especially as operating frequencies move higher and size becomes critical.

One widely used packaging technique is the "chip and wire" packaged die, which includes an encapsulated die coupled to a package carrier. The package carrier, either a substrate or metal lead frame, provides the connection from the die to the exterior of the package. In standard chip and wire packaging, the interconnection between the die and the carrier is made using bond wires. The die is attached to the carrier face up, and a wire is bonded first to the die, then looped and bonded to the carrier. Chip and wire packaged dies suffer from relatively large size and parasitic inductances, as well as having manufacturing problems with certain substrate materials.

An example of a chip and wire packaged die 100 is illustrated in FIG. 1. The die 102 is attached face up to a package carrier 104, including a metal lead frame 106, by bond wires 108. The bond wires are typically about 1-5 millimeters (mm) in length. As can be seen in FIG. 1, the lead frame 106 extends substantially beyond the edges of the die 102 in the horizontal direction. This contributes to the relatively large size of chip and wire packaged die. Even if the die itself is small, the "keep out" area (i.e., area in which no other components may be placed) on the substrate or PCB to which the die is to be attached is much larger as it must also accommodate the lead frame. Furthermore, the bond wires 108 used to connect the die to the lead frame cause series parasitic inductances due to the wire diameter and length, which may be detrimental to the overall electrical and/or RF performance of the component. A further disadvantage of the chip and wire package is that the active devices on the die 102 are separated from the carrier 104 (which may comprise a ground and/or cooling plate) by the full thickness of the die substrate. As shown in FIG. 1, a device 110 (such as a field effect transistor) is located on the upper surface of the die, far from the carrier 104, which makes thermal management of the device 110 more difficult. A common solution is to connect the device 110 to the carrier 104 by vias 112. This solution is acceptable in silicon substrates, although it does add to manufacturing complexity. However, Gallium arsenide (GaAs) substrates are very brittle and can easily break when vias, particularly a large number of vias, are drilled through the substrate.

An alternative packaging technique to the standard chip and wire package, is flip chip packaging. Flip chip describes the method of electrically connecting the die to the package carrier. In contrast to standard chip and wire packaging that uses bond wires to connect the die to the carrier, the interconnection between the die and the carrier in flip chip packaging is made through a conductive "bump" that is placed directly on the die surface. The bumped die is then "flipped over" and placed face down with the bumps connecting the die to the carrier directly. Flip chip packaging may often be used with ball grid array (BGA) type packaging. In the BGA type package, the side of the carrier opposite to that on which the die is attached has an array (generally in a grid formation) of solder balls attached thereto. This array of solder balls (or bumps) replaces the metal lead frame of a standard package.

An example of a flip chip BGA package is illustrated in FIG. 2. The die 102 is coupled to the carrier 104 which may be typically a rigid laminate or similar structure. The carrier 104 may include a ground and/or cooling plate (not shown). The flip chip connection between the die 102 and carrier 104 is generally formed in one of two ways: using conductive adhesive or, more commonly, solder. In case of solder connections, the bumped die, with solder bumps 114, is attached to the carrier 104 by a solder reflow process, very similar to the process used to connect the BGA balls 116 to the package exterior. Vias 120 may be used to interconnect the solder bumps 114 (i.e., die connections) with the balls 116 of the BGA, so as to allow connections to the die from the exterior of the package. After the die is soldered, an underfill 118, generally an epoxy, is added between the die 102 and the carrier 104. The epoxy underfill 118 is used to control the stress in the solder joints caused by the difference in thermal expansion between the die 102 (generally silicon or GaAs) and the carrier 104.

In the flip chip design, the device 110 is very close to the carrier 104, which as discussed above may include a ground/cooling plate, making thermal management easier. In addition, the chip is directly coupled to the carrier 104, eliminating the parasitic inductances associated with the bond wire connections of chip and wire packages. Flip chip BGAs have seen acceptance in the silicon arena, but are disfavored in the GaAs analog arena, largely due to added size of the BGA pattern, particularly caused by limits in bump to bump spacing, and the fragile GaAs material.

SUMMARY OF INVENTION

At least some aspects and embodiments are directed to a chip scale packaging process that allows the electrical design of the component to interact with the package to achieve exceptional RF performance and small size. Further, this exceptional RF performance and small size may be achieved with minimal complexity in the packaging process. In at least one embodiment, the packaging process may use batch techniques, including metal deposition and deposition and selective removal (e.g., by etching) of only one type of polymer, making the process suitable for high volume, low cost chip/module production.

According to one embodiment, a method of packaging a semiconductor die may comprise adhering the die to a substrate in a flip chip configuration, coating the die with a first polymer layer, selectively removing the first polymer layer to provide at least one opening to expose a portion of the die, and depositing a first metal layer over the first polymer layer, the first metal layer at least partially filling the at least one opening to provide an electrical contact to the die and including a portion that substantially surrounds the die in a plane of an upper surface of the first metal layer to provide an electromagnetic shield around the die. In one example, coating the die with the first polymer layer may comprise coating the die with SU8. In another example, the method may further comprise attaching a solder bump to the electrical contact. Furthermore, in at least one example, the method may also include acts of depositing a second polymer layer over the first metal layer, and selectively removing the second polymer layer to provide an opening over the electrical contact and allow access to the electrical contact.

One embodiment of a semiconductor device may comprise a substrate, one or more dies attached to the substrate in a flip chip configuration, the die(s) having a top surface and a bottom surface, the bottom surface disposed opposite the top surface and adhered to the substrate, a first SU8 layer disposed over the top surface over the die(s), the first SU8 layer comprising at least one opening that provides access to the die(s), a first metal layer disposed over the first SU8 layer, the first metal layer including at least one electrical contact to the die(s), and an electromagnetic shield at least partially surrounding the die(s). In one example, the electromagnetic shield may be part of the first metal layer. In another example, the semiconductor device may further comprise a second SU8 layer disposed over the electromagnetic shield. In another example, the semiconductor device may further comprise a second SU8 layer disposed over the first metal layer, the second SU8 layer comprising an opening to provide access to the at least one electrical contact. The semiconductor device may further comprise a second metal layer disposed over the second SU8 layer, the second metal layer comprising at least one bump contact electrically coupled to the electrical contact to the die(s). In this example, the second metal layer may comprise the electromagnetic shield. A solder bump may be attached to the at least one bump contact, the solder bump forming part of a ball grid array.

According to another embodiment, a method of manufacture of semiconductor devices may comprise acts of adhering a plurality of dies to a semiconductor wafer at a predetermined distance apart from one another, disposing a first layer of SU8 over the plurality of dies, selectively removing the first layer of SU8 to provide at least one access point to each one of the plurality of dies and to provide streets separating respective dies of the plurality of dies from one another, depositing metal contacts on the first layer of SU8, the metal contacts including at least one electrical contact for each die of the plurality of dies, the at least one electrical contact being made via the corresponding access point to the respective die, and depositing a metal layer on the first layer of SU8, the metal layer forming an electromagnetic shield at least partially surrounding each respective die of the plurality of dies. In one example, the method may further comprise an act of depositing a second layer of SU8 over the metal layer. Solder bumps may be attached to the metal contacts, and the wafer may be singulated along the streets to provide individual semiconductor devices.

Another embodiment is directed to a method of manufacture of semiconductor modules, each module comprising at least two dies. The method may comprise acts of attaching a plurality of dies to a plated substrate, the plurality of dies being arranged in groups to provide the semiconductor modules, each group comprising the at least two dies, disposing a first layer of SU8 over the plurality of dies, forming a plurality of openings in the first layer of SU8 to provide a first respective access point to each one of the plurality of dies, and depositing a first metal layer on the first layer of SU8 and into the plurality of openings, the first metal layer providing an electrical connection between the at least two dies of each module via the first respective access points. The method may further comprise depositing a second layer of SU8 over the first metal layer, selectively removing the first layer of SU8 to provide at least one second access point to each module, and to provide streets separating respective modules from one another, depositing metal contacts on the first layer of SU8, the metal contacts including at least one electrical contact for each module, the at least one electrical contact being made via the corresponding second access point to the respective module, and depositing a second metal layer on the second layer of SU8, the second metal layer forming an electromagnetic shield at least partially surrounding each module. The wafer may be singulated along the streets to provide individual semiconductor modules.

Still other aspects, embodiments, and advantages of the present invention, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Figure 1:
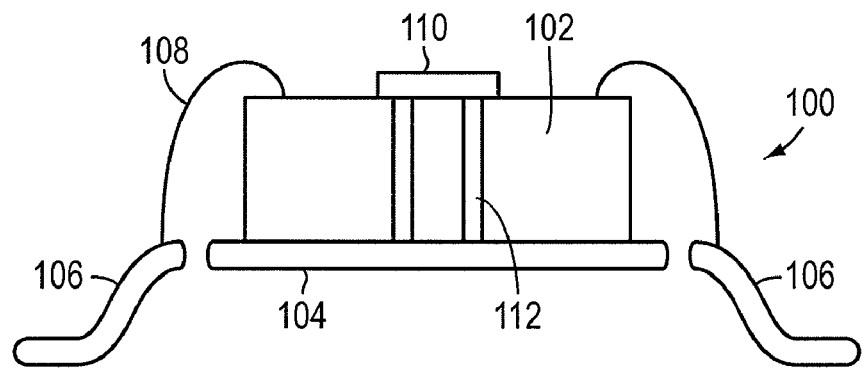
FIG. 1 is a diagram of one example of a conventional chip and wire packaged die.
Figure 2:
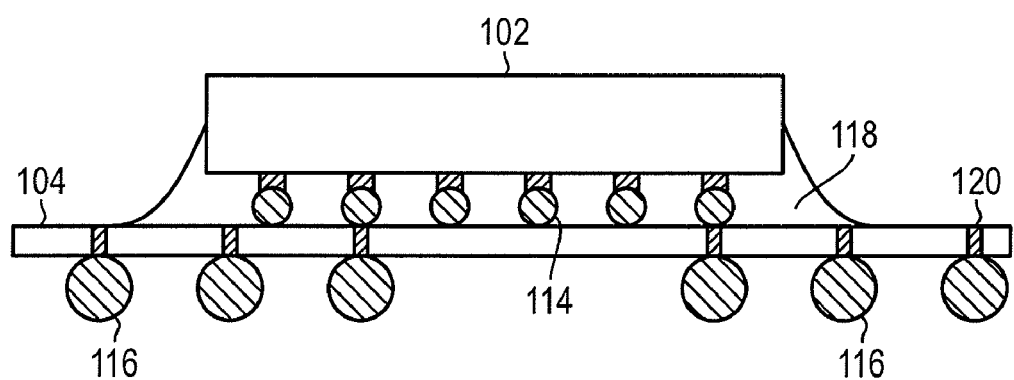
FIG. 2 is a diagram of one example of a conventional ball grid array flip chip semiconductor package.

At least some aspects and embodiments are directed to semiconductor packaging techniques and processes, and devices made according to the same. As discussed above, conventional chip and wire packaged devices suffer from several disadvantages, including relatively large size and parasitic inductance. According to at least some aspects of the invention, a near chip scale packaging process may be used, on either silicon or Gallium arsenide (GaAs) substrates, to provide flip chip ball grid array (BGA) devices that are small, robust, have excellent RF performance, or all of the foregoing. As used herein, the term "near chip scale" refers to a device package and packaging process in which the package dimensions are of approximately the same scale as those of the device or devices attached thereto. In addition, the ability to provide electromagnetic shielding may be built into embodiments of the process, thereby allowing a well shielded device to be fabricated without additional, complex processing steps, as discussed further below.

According to some embodiments, chip design and package design may flow sequentially, allowing the design of the chip to incorporate the package design. Unlike conventional chip and wire packaging in which the chip must conform to one of a few available packages, embodiments of the invention allow the package to conform to the chip design, and may thereby enable a more flexible design process and smaller, more space-efficient chips. For example, with conventional chip and wire packages, bond pads must be arranged along the periphery of the die so as to allow the bond wires to connect the die to the lead frame of the package. By contrast, using a flip chip BGA and packaging process according to aspects of the invention, a die and package may be designed together to allow flexible die layout, with no need for peripheral bond pads. This may provide advantages such as reduced power/ground inductances and reduced noise, as power can be brought directly into the core of the die rather than having to be routed to the edges. In addition, the flip chip arrangement may provide higher signal density as the entire surface of the die may be used for interconnections, rather than only the edges, as with a conventional chip and wire package. Thus, the flip chip design can support a far greater number of interconnections on the same die size compared to a bond wire connected die. Furthermore, mounting the die flip chip allows access to the die surface and provides better thermal management compared to conventional chip and wire packaged dies. At least some embodiments may provide a small package with very low inductance (by virtue of the lack of bond wires and the short inductive path of the BGA) and high performance over broad frequency ranges, as discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

According to at least one embodiment of a packaging process, the die may be flip chip and encapsulated in a polymer. The polymer may support metal plated patterns that can interconnect additional die as well as interface with a BGA pattern. Thus, the process may allow for an area sensitive die to be interconnected to other die and to act as an interposer to an industry standard BGA pattern. In addition, metal shielding may be incorporated inside the package, thus managing RF interference and harmonic issues, as discussed further below. Since the die is flipped, the interconnect paths can be well managed to reduce or minimize inductance and to provide very short paths to thermal heat sinks, if desired or necessary. Furthermore, since the process uses batch techniques (i.e., layer deposition and selectively removal), thousands of modules may be produced simultaneously on a wafer.

Figure 3:
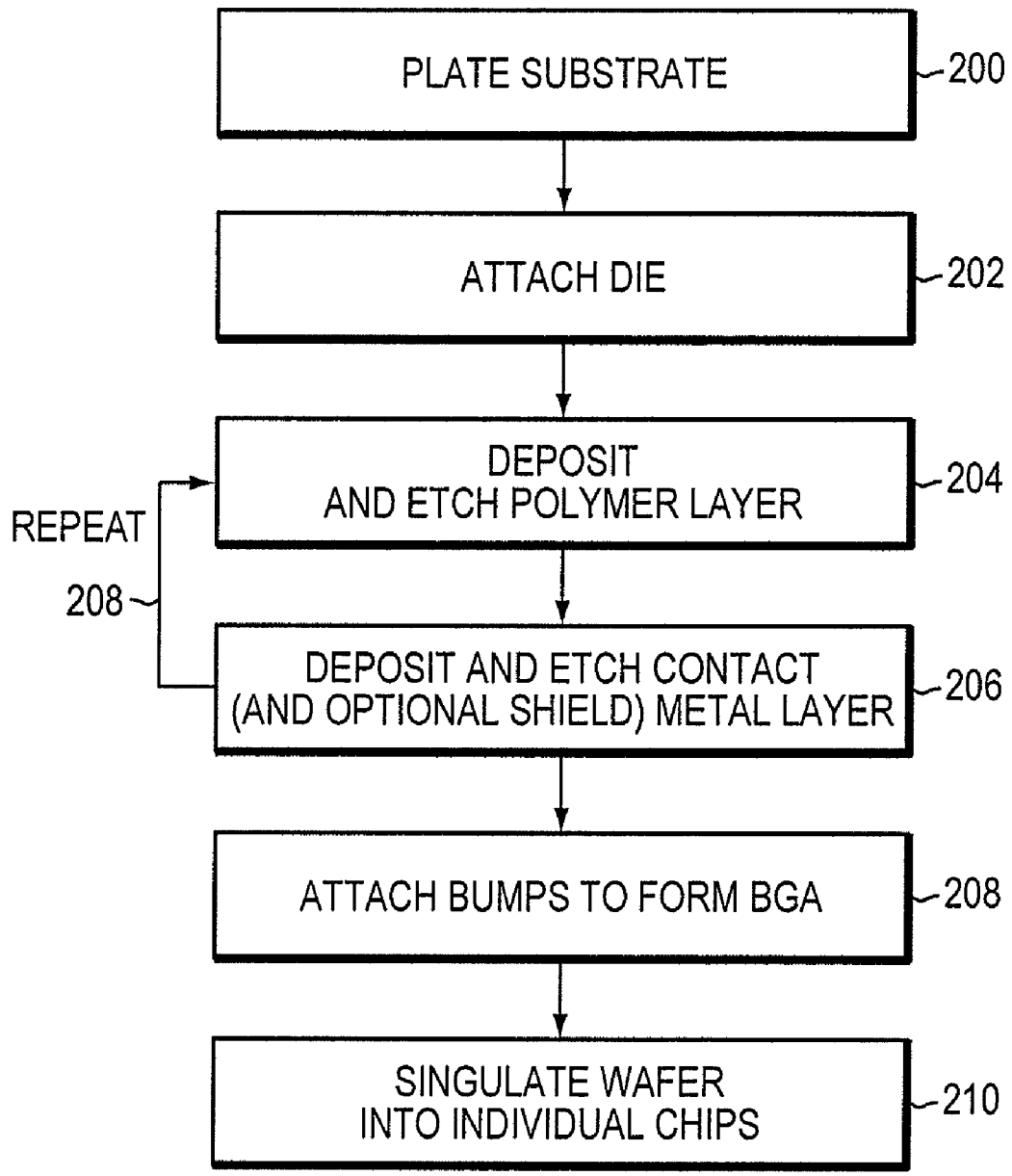
FIG. 3 is a flow diagram, illustrating one example of a process according to aspects of the invention.

A flow diagram of one example of a near chip scale packaging process is illustrated in FIG. 3. Aspects of the process are discussed below with continuing reference to FIG. 3.

Figure 4:
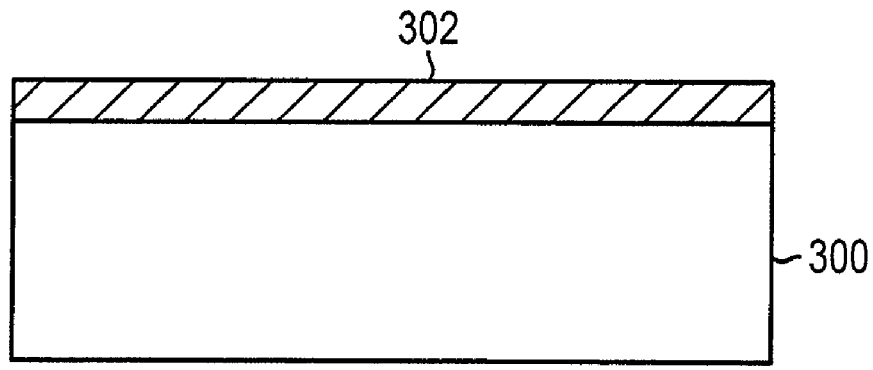
FIG. 4 is a cross-sectional diagram of a plated substrate.

Referring to FIGS. 3 and 4, in a first step 200, a substrate 300 may be plated with one or more metal layers, shown collectively in FIG. 4 as layer 302. In one example, metal layer 302 may comprise a very thin titanium layer, having a thickness of, for example, about 1000 Angstroms (Å). This titanium layer may be covered by a thin gold layer having a thickness of, for example, about 2000 Å. In another example, a standard plated substrate may be purchased and the process may therefore skip step 200 and begin at step 202 with an already plated substrate. The substrate may generally be a silicon substrate, but may also be Gallium arsenide (GaAs) or another material.

Figure 5:
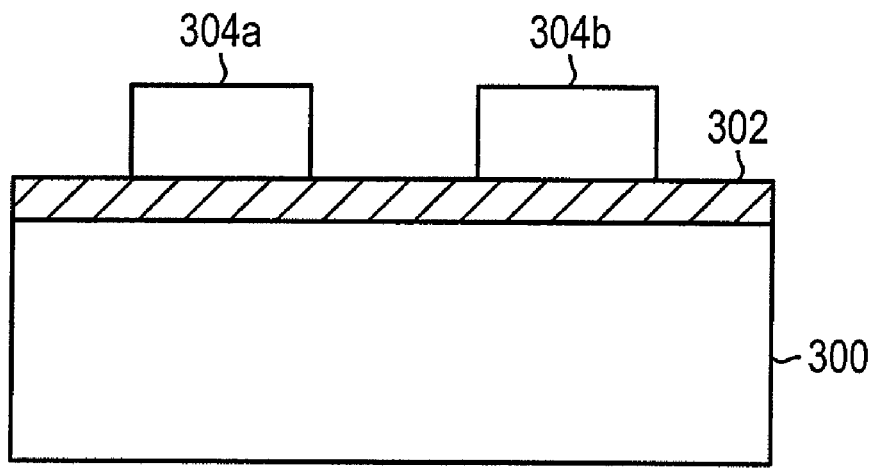
FIG. 5 is a cross-sectional diagram of the plated substrate of FIG. 4, having two dies attached thereto, in accordance with aspects of the invention.
Figure 6:
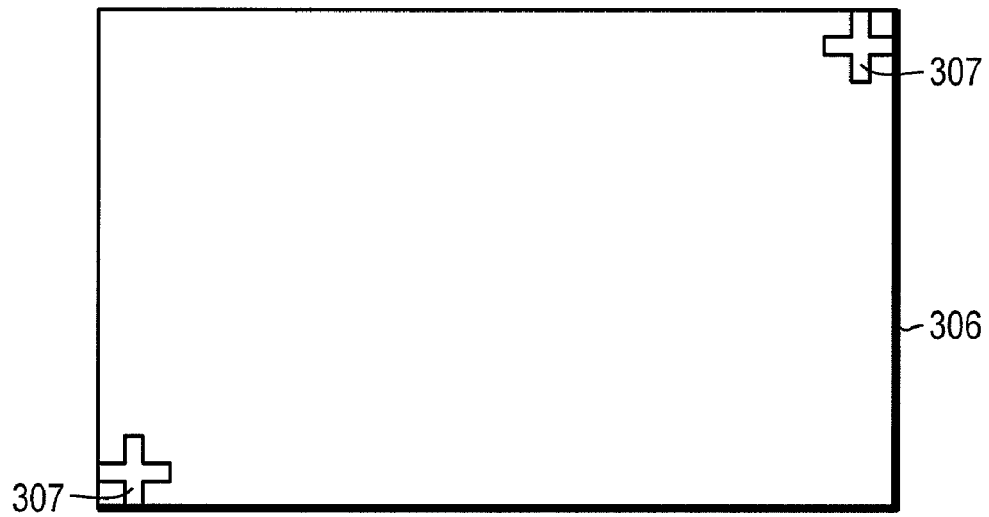
FIG. 6 is a schematic illustration of a top plan view of a mask showing an outline of a chip with alignment marks.
Figure 7:
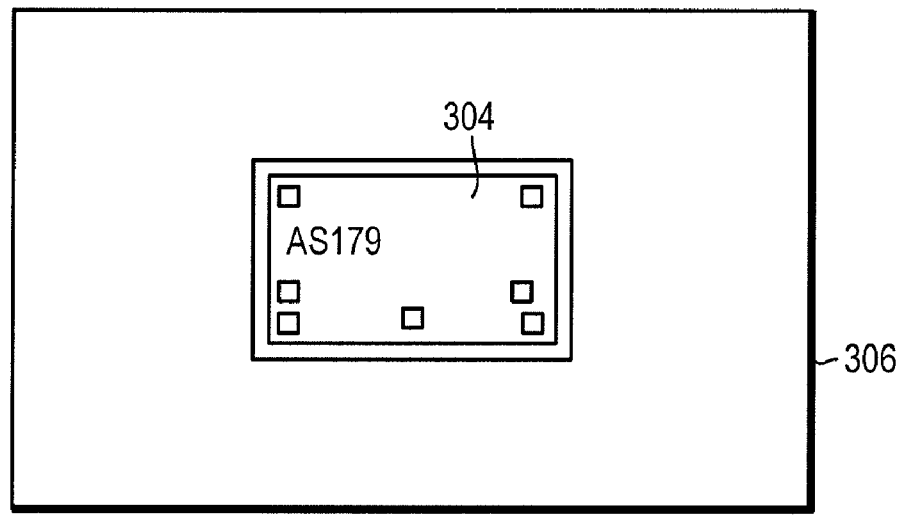
FIG. 7 is a top plan view of the outline of FIG. 6 showing a die positioned within the outline.

Referring to FIGS. 3 and 5, in step 202, a die 304 may be attached to the plated substrate 300. The die is attached flip chip. FIG. 5 illustrates two dies 304a, 304b positioned apart by a predetermined distance on the substrate 300. It is to be appreciated that the substrate may be part of a semiconductor wafer that may have hundreds, or even thousands, of die attached at predetermined spacing, and that eventually will be singulated such that each packaged die forms a single chip. Thus, FIG. 5 illustrates a portion of such a wafer. The die 304 may be attached using, for example, an epoxy, a solder process, or another adhesive. Placement and position of the die on the substrate may be facilitated by the use of alignment marks, or fiducials, etched into the plated substrate. FIG. 6 illustrates schematically a mask showing an outline 306 of the substrate area reserved for a chip and alignment marks 307. FIG. 7 illustrates schematically a top view of the chip outline 306 with the die 304 positioned therein.

Figure 8:
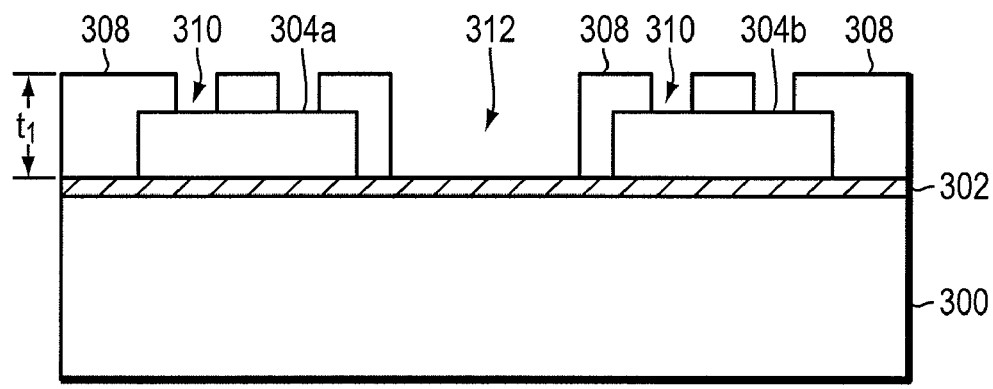
FIG. 8 is a cross-sectional diagram of the structure of FIG. 5, also showing a polymer layer, in accordance with aspects of the invention.
Figure 9:
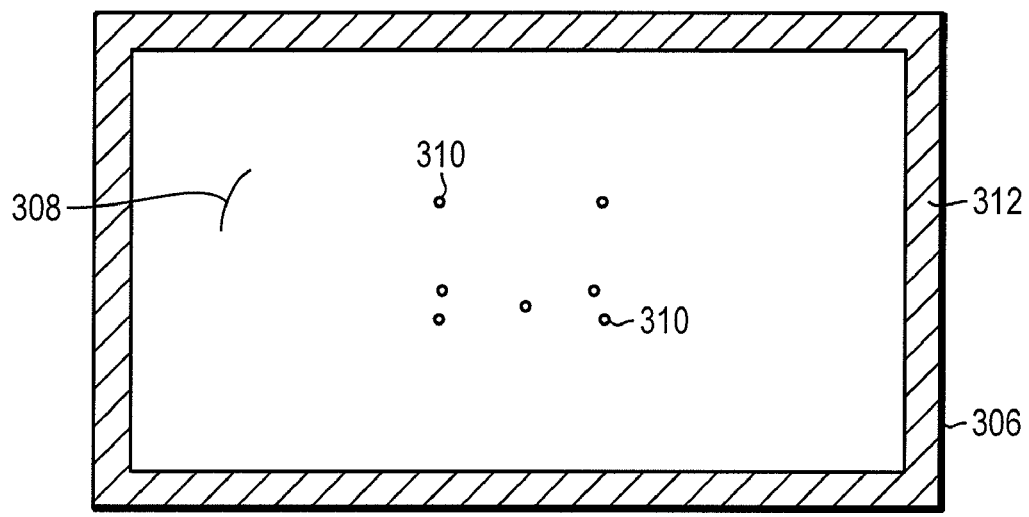
FIG. 9 is a top plan view of a mask showing the polymer layer of FIG. 8.

In a next step 204, a polymer layer may be disposed on the plated substrate, over the die 304, and openings may be formed in the polymer layer by selectively removing (for example, by etching or another process) portions of the polymer layer. Referring to FIG. 8, there is illustrated a cross-sectional diagram of the wafer portion of FIG. 5, illustrating a polymer layer 308 formed in step 204. The layer 308 has openings 310 formed therein which will be used to form electrical contacts to the die 304, as discussed further below. Another opening 312 is also provided in the layer 308, this opening being referred to as a "street" which forms a dividing line separating two chips, along which the wafer will be singulated into individual chips, as discussed further below. FIG. 9 illustrates a top view of the chip outline of FIGS. 6 and 7, showing the polymer layer 308 and the openings 310 and street 312 formed therein.

According to one embodiment, the layer 308 may comprise the polymer SU8. SU8 is a photo-imagable epoxy. However, it is to be appreciated that the invention is not limited to the use of SU8 and other similar or equivalent polymers or epoxies may be used instead. In one example, the layer 308 may have a thickness, t1, of about 25 microns. However, it is to be appreciated that this thickness is an example only and the layer 308 may have varying thicknesses depending, for example, on the application, process and/or material used. It is further to be appreciated that although deposition and selectively removal of the polymer layers is illustrated in FIG. 3 as one step (step 204), in practice, step 204 may be split into two or more process steps. For example, step 204 may include a first process step (204a) in which the layer is deposited, and a second process step (204b) in which the layer is selectively removed to provide openings.

Figure 10:
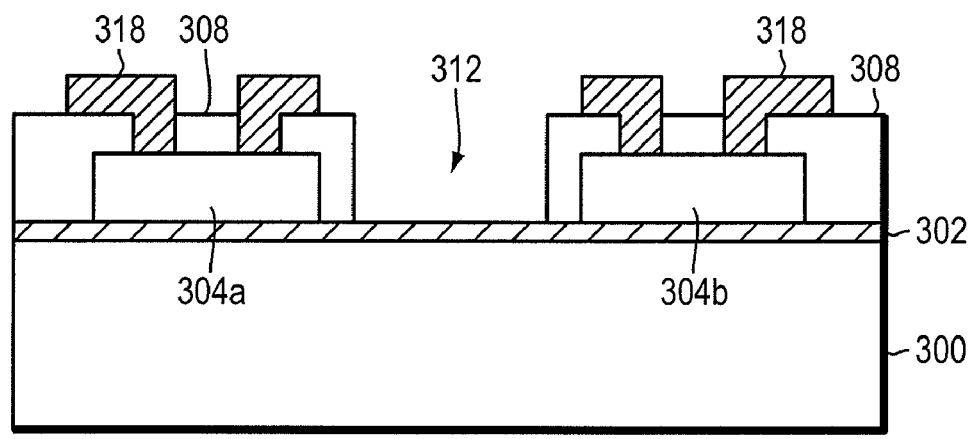
FIG. 10 is a cross-sectional view of the structure of FIG. 8, additionally showing metal contacts.

Still referring to FIG. 3, in step 206 a metal layer may be applied to the wafer, over the polymer layer, to form electrical contacts for the chips. Referring to FIG. 10, there is illustrated a cross-sectional view of the wafer portion of FIG. 8, following step 206. FIG. 10 shows the metal contacts 318 formed in the openings 310 of the polymer layer 308. In one embodiment, additional metallization may be deposited in step 206 to provide electromagnetic shielding for the chips, as discussed further below. According to another embodiment, repeated layers of SU8 and metal interconnects may be applied (as indicated by arrow 208), depending on the circuit and die complexity, before bumping is added to complete the BGA.

Figure 11:
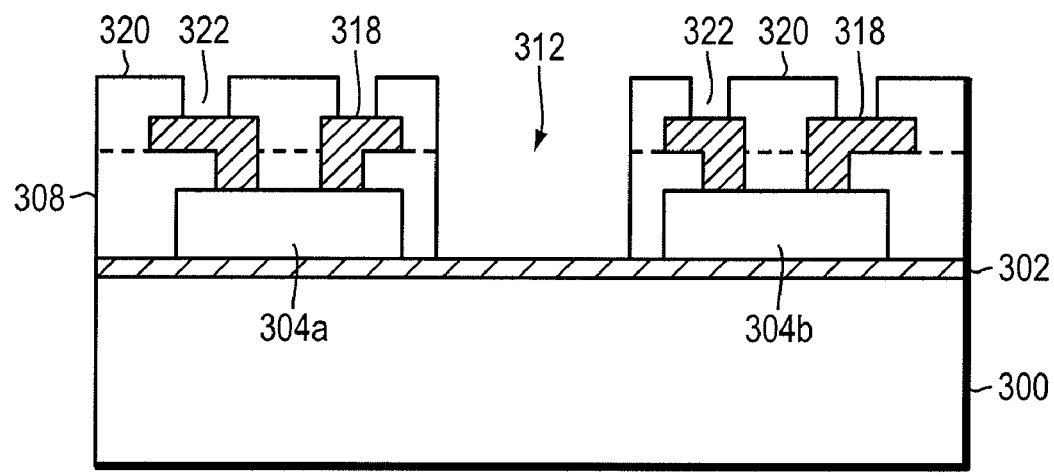
FIG. 11 is a cross-sectional view of the structure of FIG. 10, also showing a second polymer layer.

According to one embodiment, a further layer of polymer (e.g., SU8) may be deposited over the first metal layer that provides the contacts 318. This is illustrated in FIG. 11, which shows the wafer portion of FIG. 10, further comprising a second polymer layer 320. The second polymer layer 320 may be selectively removed to form openings 322 which are used to form electrical connections to the metal contacts 318 below. In at least one example, one or more of the polymer layers may comprise SU8 combined with one or more additives. In particular, in at least one example, an upper or final polymer layer, e.g., the second polymer layer 320 in the example illustrated in FIG. 11, may comprise SU8 with an optically opaque additive combined therewith. Such additives may include, for example, Iron oxide, Nickel oxide, Aluminum oxide, Titanium oxide, Calcium titrate, Zinc oxide, Zirconium oxide and Tin oxide.

Figure 12:
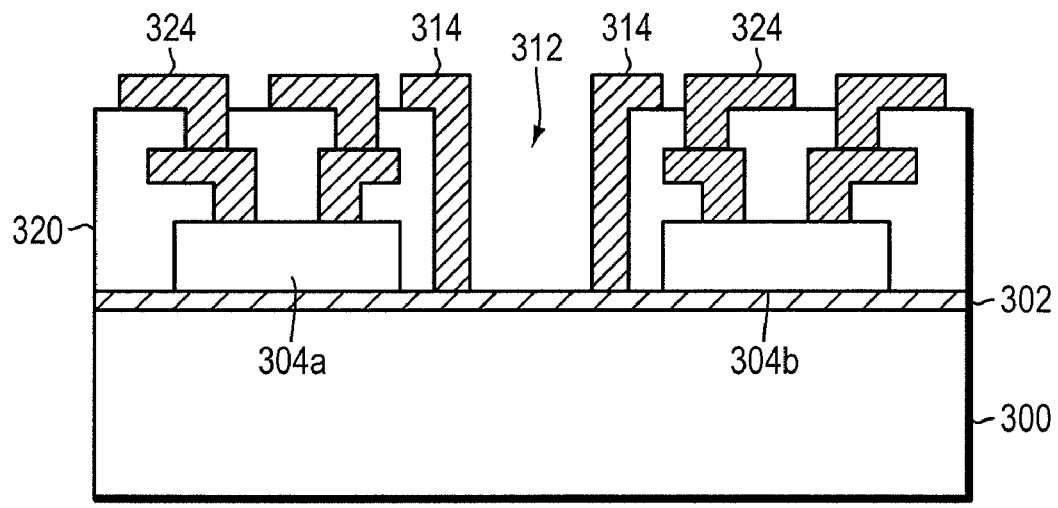
FIG. 12 is a cross-sectional view of the structure of FIG. 11, also showing an additional metal layer disposed over the second polymer layer.

Referring to FIG. 12, a second metal layer 324 may be deposited over the second polymer layer 320. This second metal layer 324 may extend the contacts 318 to above the surface of the second polymer layer 320, and may also be used to provide a built-in Faraday cage 314 for electromagnetic shielding around the chips. In one example, the shield metal may extend from ground contacts in the chip, around the chip, thus providing the Faraday cage 314. It is to be appreciated that the shielding is not complete because, at least for most components, breaks in the shield may be provided for RF in/out and DC bias in/out signal paths. Furthermore, it is to be appreciated that in some examples, multiple shielding may be provided so as to shield individual components within a module as well as to shield the entire module/chip. The shield metal layer may, for example, comprise a very thin gold layer. Thus, in at least one example, an additional polymer layer (not shown) may be provided over the shield metal layer to protect the shield. As discussed above, this additional polymer layer may comprise SU8 with an optically opaque additive mixed therewith, particularly if this layer forms the top-most or final polymer layer of the package.

Figure 13:
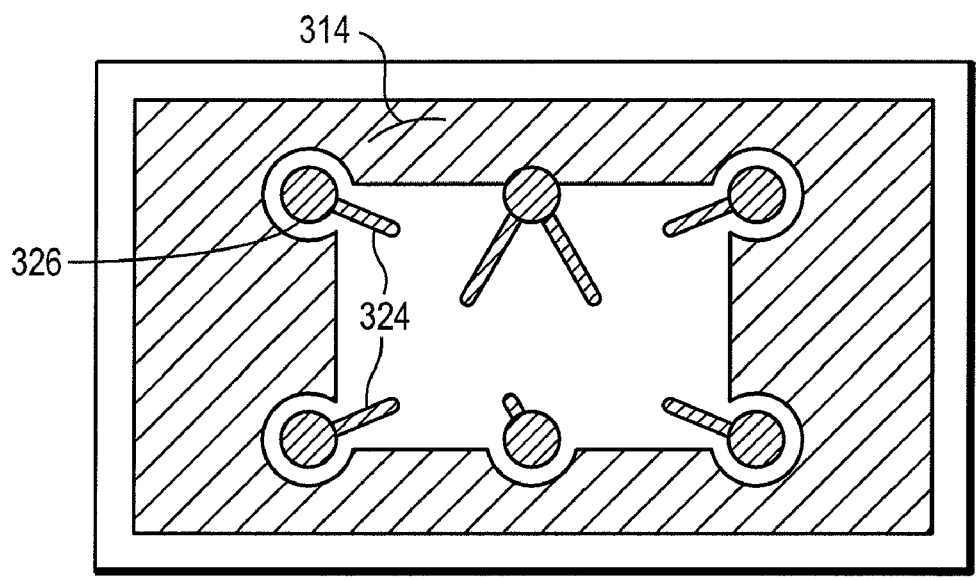
FIG. 13 is a top plan view of the outline of FIG. 6 also showing an example layout of a metal layer.

Referring to FIG. 13, there is illustrated a top view of one example of a layout of the second metal layer 324 inside the chip outline of FIGS. 6 and 7. In this example, the die is a single pole, double throw switch and the metal layer 324 is therefore laid out to provide appropriate contacts for the switch. It is to be appreciated that the layout of metal layer 324 (and that of the first metal layer deposited in step 206) may vary depending on the circuit implemented in the die. In the illustrated example, the metal layer includes a portion forming the Faraday cage 314 and portions forming the extended contacts 324. The contacts 324 end in enlarged portions 326 to which the bumps of the BGA will be attached.

Figure 14:
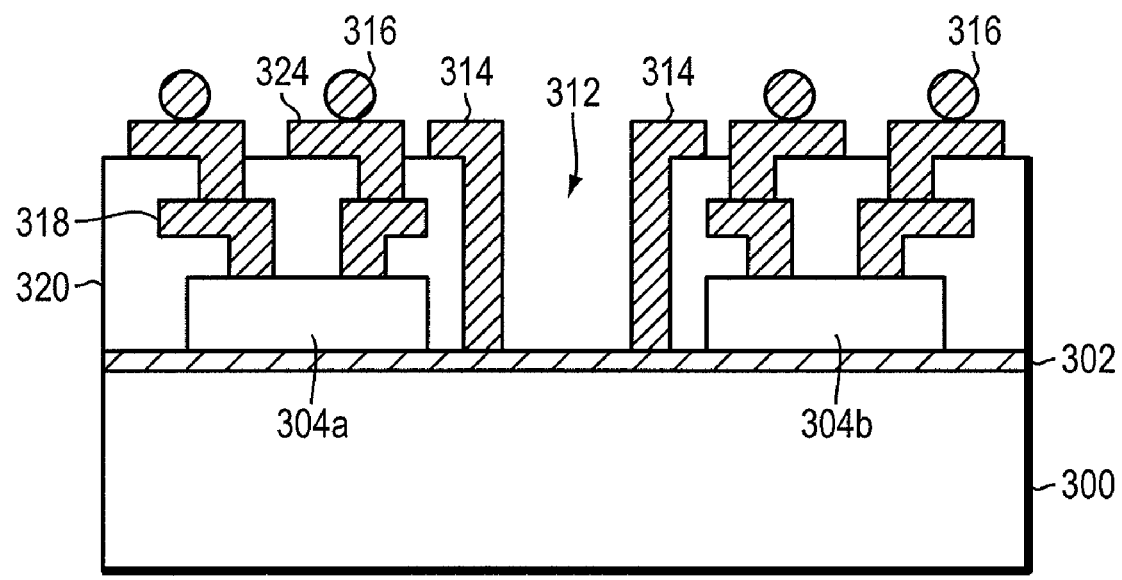
FIG. 14 is a cross-sectional view of the structure of FIG. 12, additionally showing bumps attached to the metal contacts.

Referring again to FIG. 3, once deposit and selectively removal of all the metal and polymer layers has been completed, the bumps of the BGA are attached in step 208. FIG. 14 illustrates the structure of FIG. 12 also including bumps 316 that are part of the BGA. Finally, in step 210, the wafer may be singulated along the streets 312 to provide individual packaged chips. Depending on the circuitry of the die, these chips may be discrete devices (e.g., single pole, double throw or multi-throw switches, an amplifier, a filter or another device) or may be modules, containing one or more devices, that may be interconnected with other modules to form a combination chip. As discussed above, the package produced by embodiments of the process may be easily interconnected to other die, and may therefore have an ideal module format.

Figure 15:
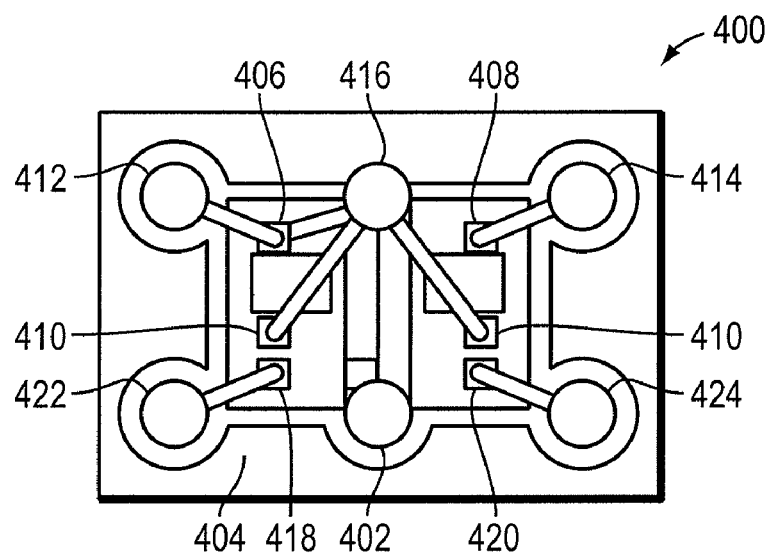
FIG. 15 is a top view of one example of a single pole, double throw switch made according to an embodiment of the process according to the invention.
Figure 16:
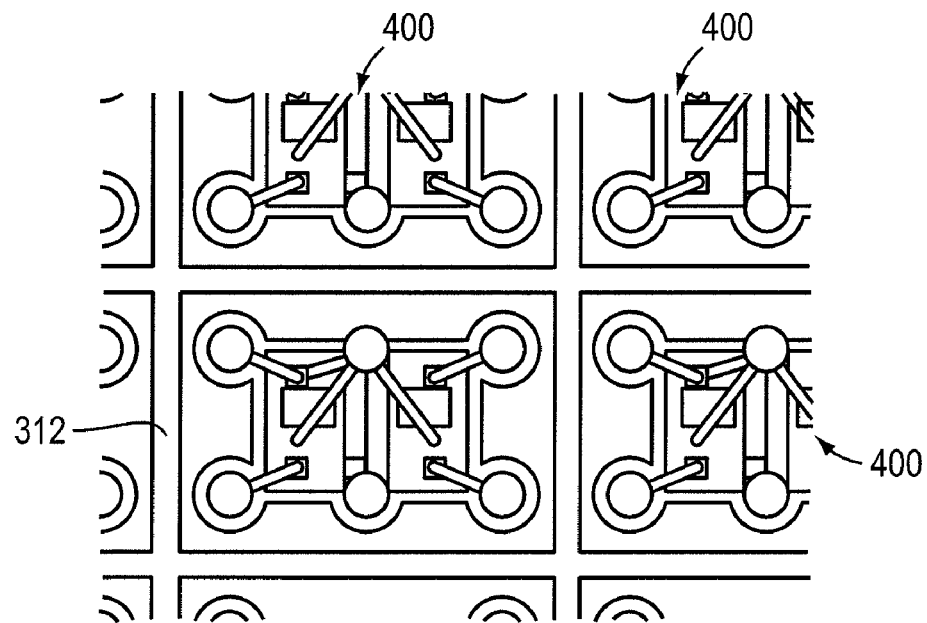
FIG. 16 is a top view of a portion of a wafer illustrating several examples of the single pole, double throw switch of FIG. 16, separated by streets.

An embodiment of the above-discussed near chip scale packaging process was used to fabricate a single pole, double throw switch using GaAs. A top view of an example of the switch is illustrated in FIG. 15. The switch 400 includes a ground contact represented by ball 402 of the BGA that is coupled to metal shielding 404, as discussed above. The switch was mounted to a gold plated silicon substrate, which was connected to the ground, and thus to the shielding, to create a ground shroud or Faraday cage. The switch comprises two RF_out contacts 406 and 408, and an RF_in common port 410, each coupled respectively to balls 412, 414 and 416 of the BGA. The switch also comprises two DC bias terminals 418, 420, coupled respectively to balls 422 and 424. Of course, it is to be appreciated that the I/O is reversible, such that port 410 could be used as a common output port and ports 406 and 408 could be used as distinct input ports. FIG. 16 illustrates a portion of an example wafer comprising multiple such switches 400 separated by streets 312.

Examples of the switch of FIG. 15 were subjected to several tests, and performance of at least one example switch was measured. In one example, the switch was subjected to a mechanical/die shear test, which tests the strength of adhesion of the die to the substrate. The switch was capable of withstanding at least 250 grams of shear force. In another example, the switch was subjected to a bump shear test which tests the strength of adhesion of the bumps to the substrate. Again, the switch was capable of withstanding at least 250 grams of shear force. In these examples, the switch was fabricated using lead-free solder which is more brittle than traditional leaded solder and usually contributes to reduced robustness of conventionally packaged devices. In another example, the switch underwent and passed preliminary HAST (highly accelerated stress testing) at a temperature of 131 degrees Celsius, 85% humidity, and with −5 Volts applied to the bias ports for a period of 96 hours.

Although there have been previous attempts to produce similar flip chip BGA packages, these attempts are believed to have used multiple types of polymers and many additional process steps, such as grinding, that prohibit entry to markets demanding low cost, high volume products, such as the commercial wireless market. By contrast, the process according to at least one embodiment of the invention uses only one type of polymer (e.g., SU8) and requires no additional grinding of the package interconnect surface. In addition, contacts on the chip may be made using copper which is less expensive than the gold typically required for wire bonds. Furthermore, as discussed above, since the process uses batch techniques (i.e., layer deposition and selectively removal), thousands of modules may be produced simultaneously on a wafer, allowing for high volume manufacturing. These factors, together with the simple process steps and the small size of the packaged chip, contribute to the low cost of chips produced in accordance with aspects of the invention. In addition, the small size and high performance (as illustrated below) of the devices meet the demands of the wireless market, and also make these devices well suited to many other markets and applications.

Figure 17:
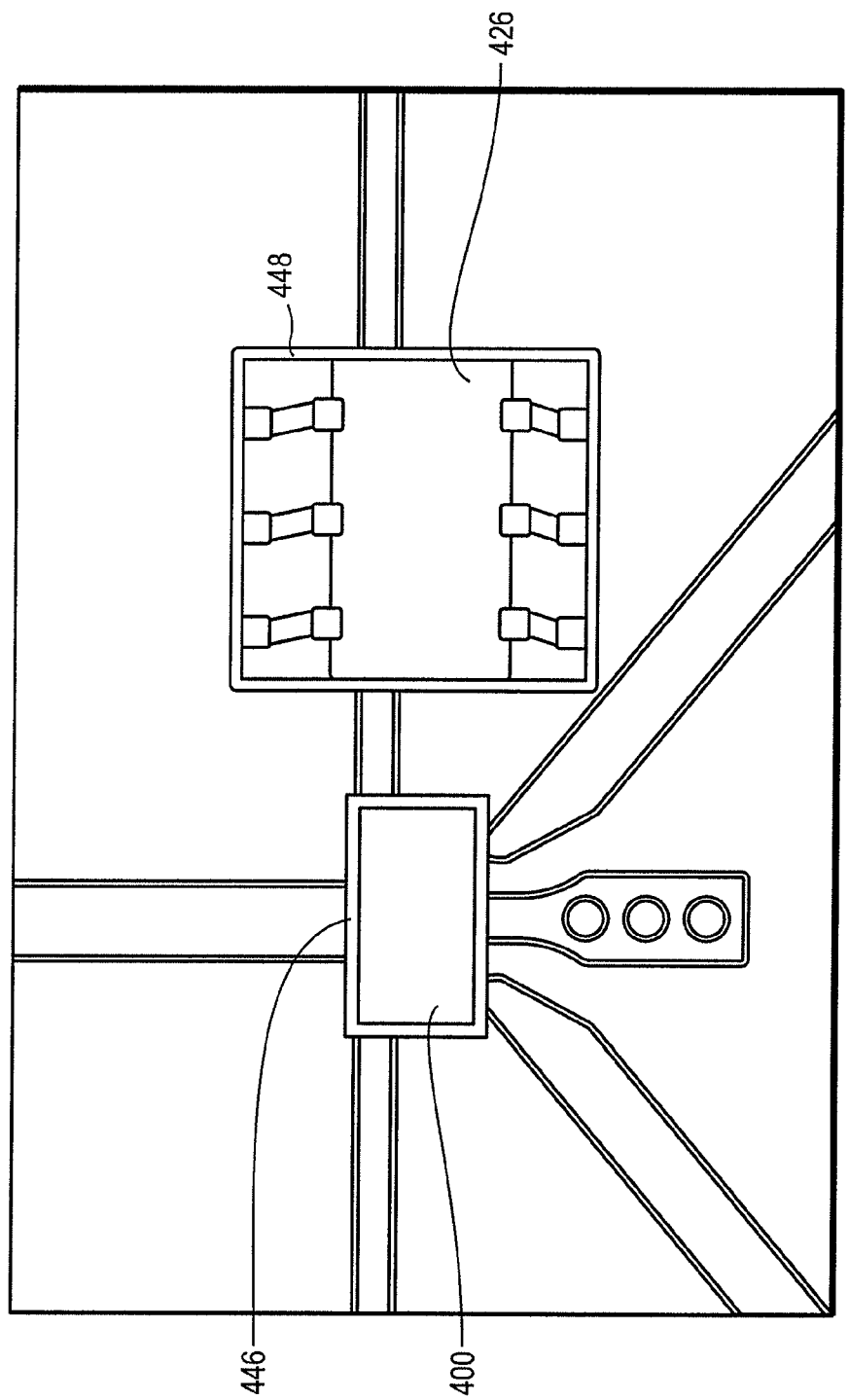
FIG. 17 is a top view of a conventional chip and wire packaged semiconductor device and of a semiconductor package according to aspects of the invention, illustrating the difference in footprint size between the two devices.

Referring to FIG. 17, there is illustrated a top view of an example of a switch 400 according to aspects of the invention. For comparison of size, FIG. 17 also illustrates a top view of a similar single pole, double throw switch 426 in a conventional chip and wire package. FIG. 17 is drawn to scale to show the size difference between the two packages. As can be seen from FIG. 17, the switch 400 has a smaller package size than does the conventionally packaged switch 426. In addition, when the lead frame of the switch 426 is included, the footprint 448 (and thus "keep out area") of the conventionally packaged switch 426 is far greater than that of the switch 400.

Figure 18:
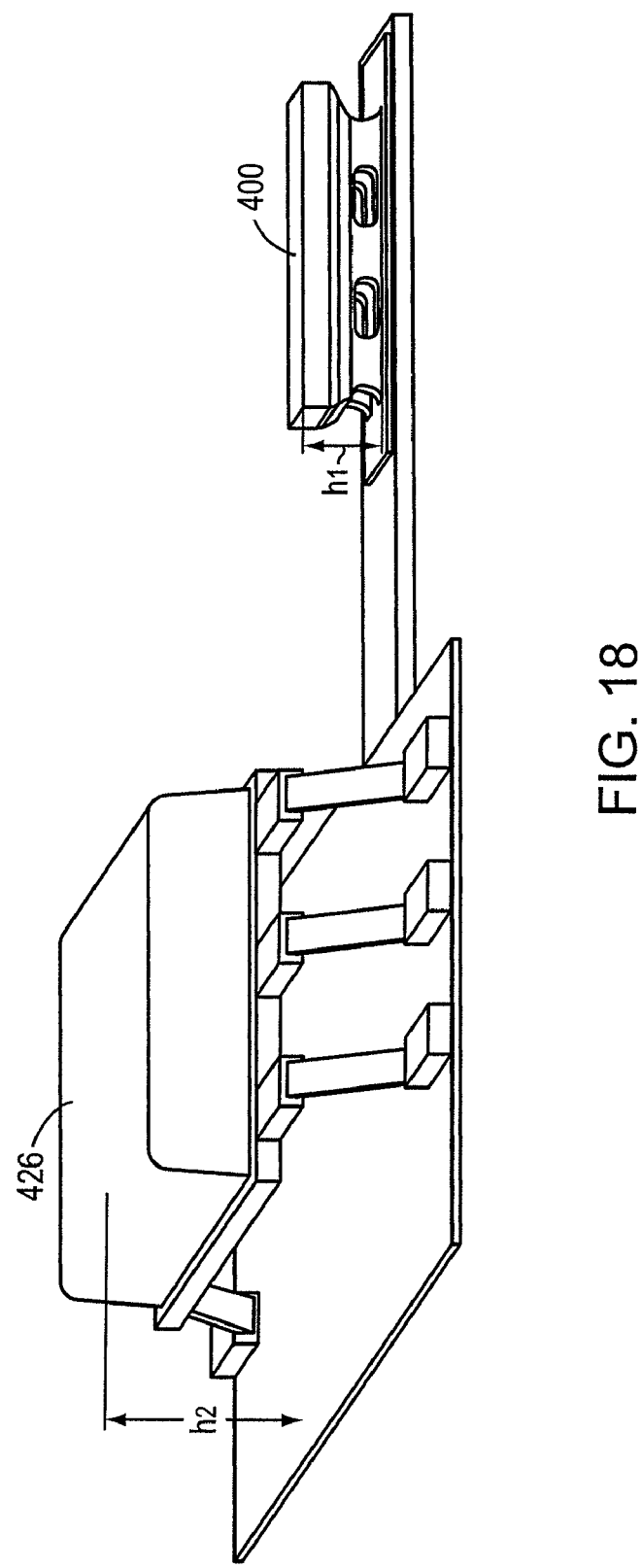
FIG. 18 is a side view of the two devices of FIG. 17, illustrating the difference in height between the two devices.

Referring to FIG. 18, there is illustrated a side view of the two switches 400, 426 of FIG. 17. For proper comparison of size of the two switches, FIG. 18 is drawn to scale. It can be seen that the switch 400 also has a far lower profile (lower height, h1) than does the conventionally packaged switch 426 (i.e., height h2>h1). The reduced height of the switch 400 saves vertical space, allowing for a more compact circuit board (to which the switch and other similarly packaged devices may be attached) and allows the switch to withstand far greater die shear force. Furthermore, due to the reduced footprint and height of the switch, the switch may occupy about one seventh the volume of a standard packaged GaAs single pole, double throw switch.

Figure 19:
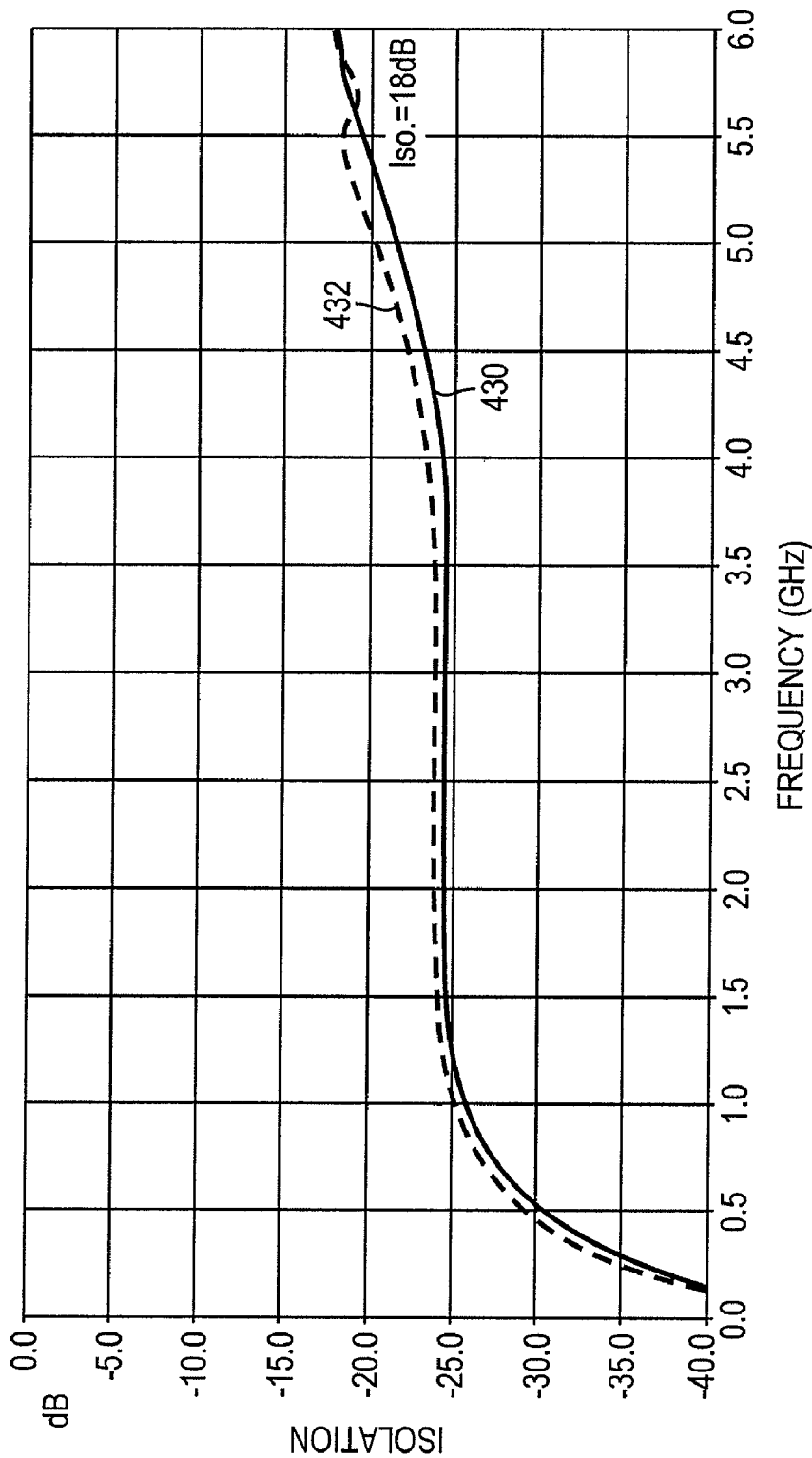
FIG. 19 is a plot of isolation vs. frequency for one embodiment of a single pole, double throw switch according to aspects of the invention.

In one example, the isolation performance of the switch according to an embodiment of the invention was tested. In this example, the S21 isolation was measured over a frequency range extending from DC (about 0 Hz) to 6.0 Gigahertz (GHz). The S31 isolation was also measured over the same frequency range. For these tests, the switch was connected to a device under test board and the tests were performed at ambient air temperature. A control voltage of 5.0 V was used. A plot of the measured isolation in decibels (dB) is illustrated in FIG. 19. Trace 430 represents the S21 isolation and trace 432 represents the S31 isolation. As can be seen from FIG. 19, the switch fabricated in accordance with the present invention achieves an isolation of about 18 dB at 6 GHz, and greater than 20 dB from 0 to 5.0 GHz (significantly greater than 20 dB below 4.5 GHz).

Figure 20:
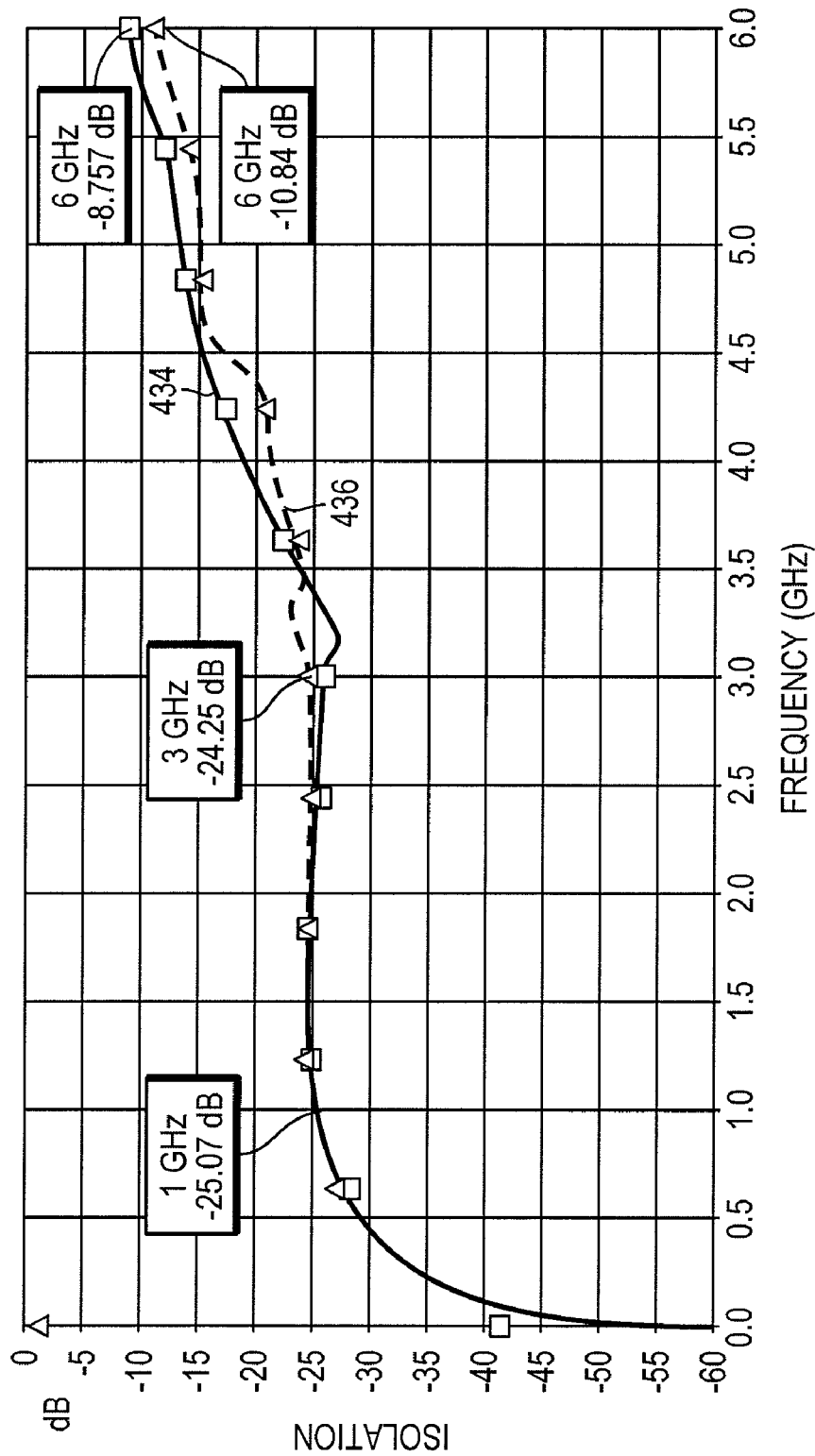
FIG. 20 is a plot of isolation vs. frequency for two example conventional single pole, double throw switches.

For comparison, the S21 isolation was measured for two conventional switches over the same frequency range (0-6 GHz) and under the same test conditions (i.e., the same temperature, control voltage, etc.). A plot of the measured isolation vs. frequency for each of the two conventional devices is illustrated in FIG. 20. The first device was a standard package (i.e., chip and wire packaged) single pole, double throw switch commercially available from Skyworks Solutions, Inc. of Woburn, Mass. under the part number AS179. The measured isolation for this device is illustrated in FIG. 20 as trace 434. As can be seen from FIG. 20, the first device achieved an isolation of about −8.757 dB at 6 GHz. The second device was a conventional flip-chip packaged single pole, double throw switch. The measured isolation for this device is illustrated in FIG. 20 as trace 436, and it can be seen that the device achieves an isolation of about −10.84 dB at 6 GHz. By comparing FIGS. 19 and 20, it can be seen that the switch according to aspects of the invention achieves at least as good isolation over the frequency range as do the two conventional devices, and performs substantially better at high frequencies (above 4.5 GHz).

Figure 21:
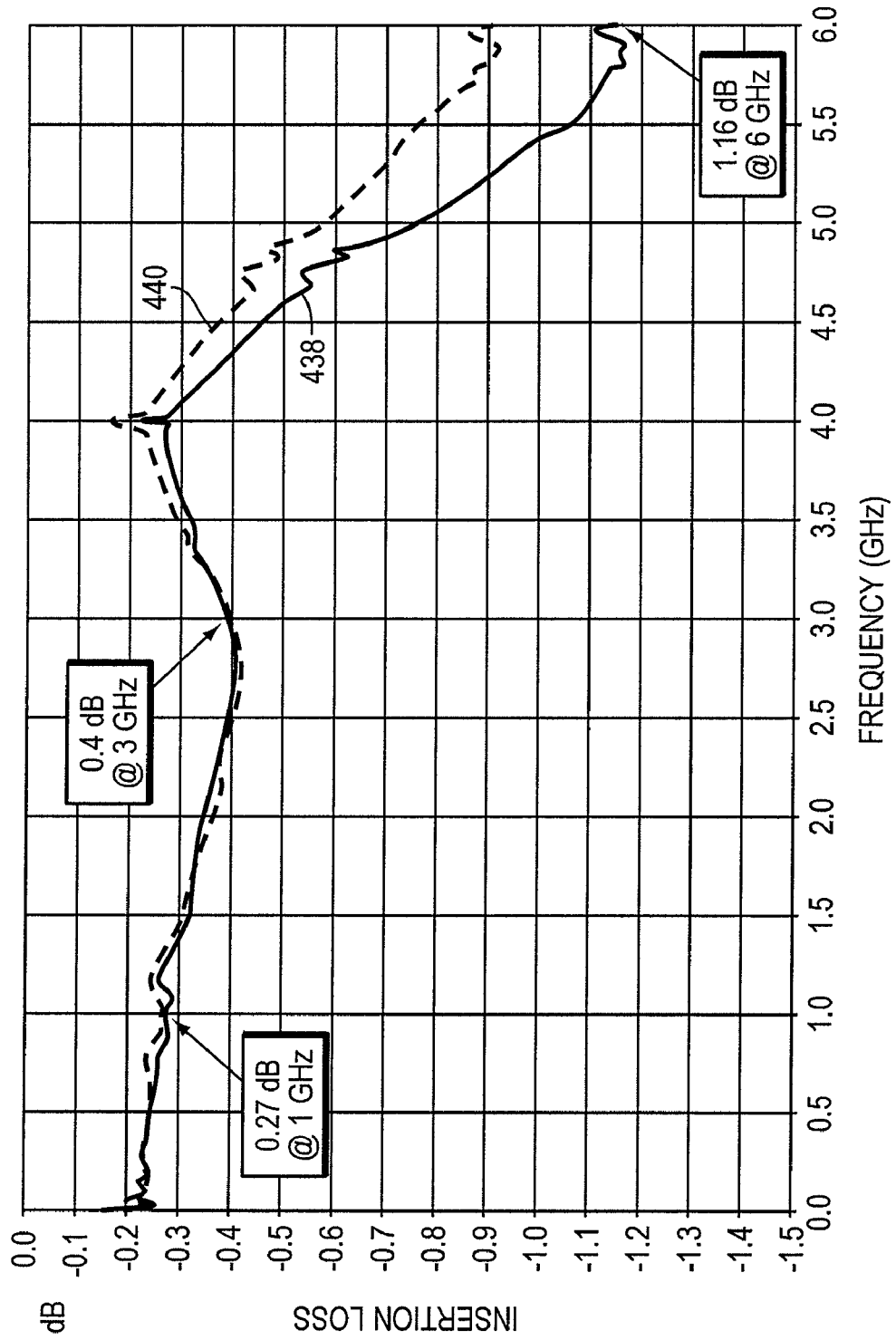
FIG. 21 is a plot of insertion loss vs. frequency for the same embodiment of the single pole, double throw switch.

In another example, the insertion loss of the switch according to at least one embodiment of the invention was tested over the frequency range 0-6 GHz. Both the S21 insertion loss (i.e., insertion loss when the switch is configured such that one RF_out port (designated port 2) is connected to the common RF_in port (designated port 1)), as well as the S31 insertion loss (i.e., with the other RF_out port (designated port 3) connected to the common RF_in port) were measured. For these tests, the switch was again connected to the device under test board, the control voltage was 5.0 V, and the tests were carried out under ambient air temperature conditions. Referring to FIG. 21, there are illustrated plots of the S21 insertion loss vs. frequency (trace 438) and S31 insertion loss vs. frequency (trace 440). As can be seen from FIG. 21, the switch can achieve an insertion loss of about −1.16 dB at 6 GHz and has good performance over the entire frequency range.

Figure 22:
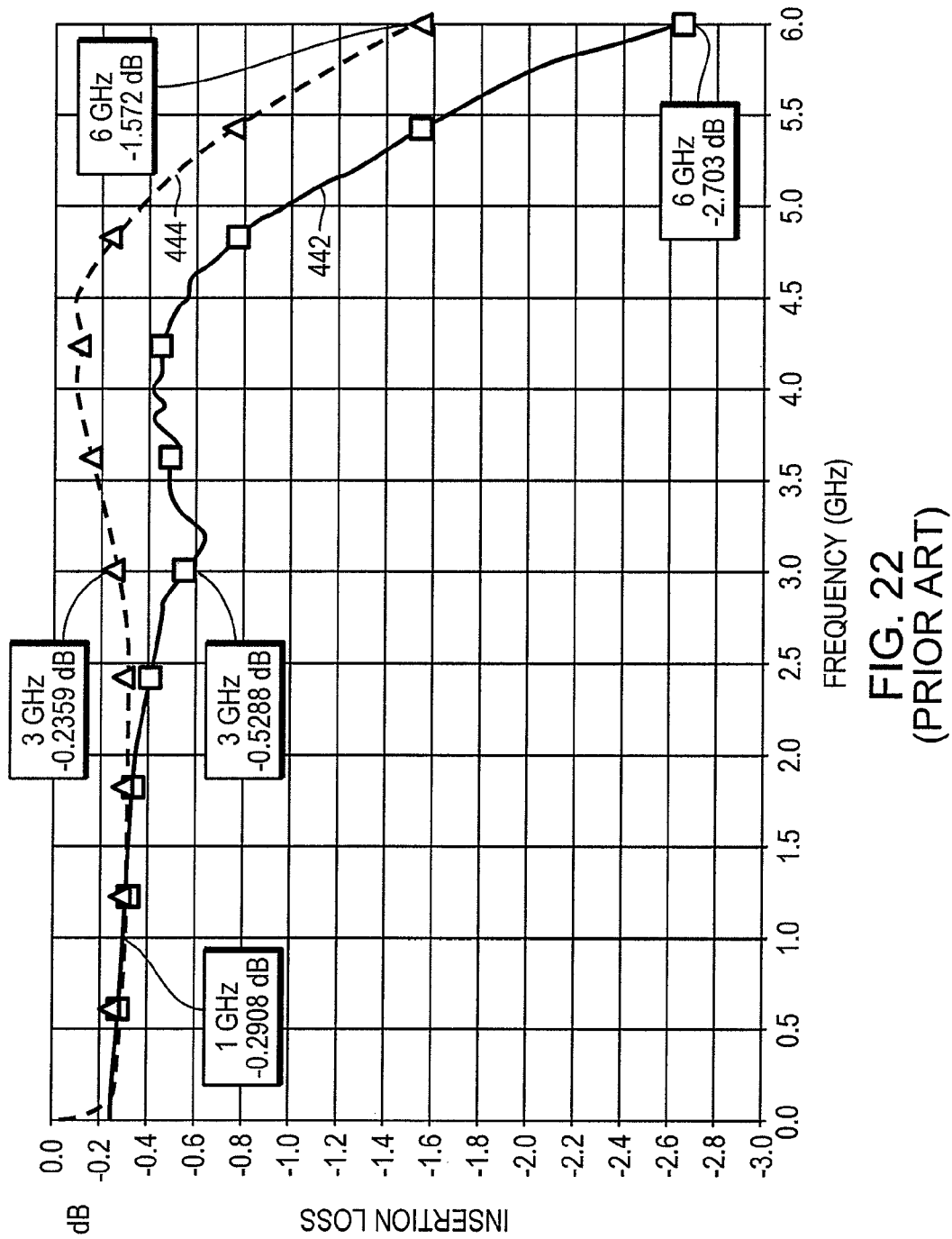
FIG. 22 is a plot of insertion loss vs. frequency for the same two example conventional single pole, double throw switches.

For comparison, the insertion loss performance for the two conventional devices discussed above was measured over the same frequency range under the same test conditions. The results are illustrated in FIG. 22. Trace 442 represents the measured S21 insertion loss vs. frequency for the first conventionally packaged device, and trace 444 represents the measured S21 insertion loss vs. frequency of the second conventional flip-chip packaged device. As can be seen by comparing FIGS. 21 and 22, the switch according to aspects of the invention achieves better insertion loss performance at the upper end of the frequency range than do either of the two conventional devices. As discussed above, the switch according to aspects of the invention achieved an S21 insertion loss of about −1.16 dB at 6 GHz, whereas the second conventional device achieved −1.572 dB and the first conventional device achieved only −2.703 dB at 6 GHz.

Figure 23:
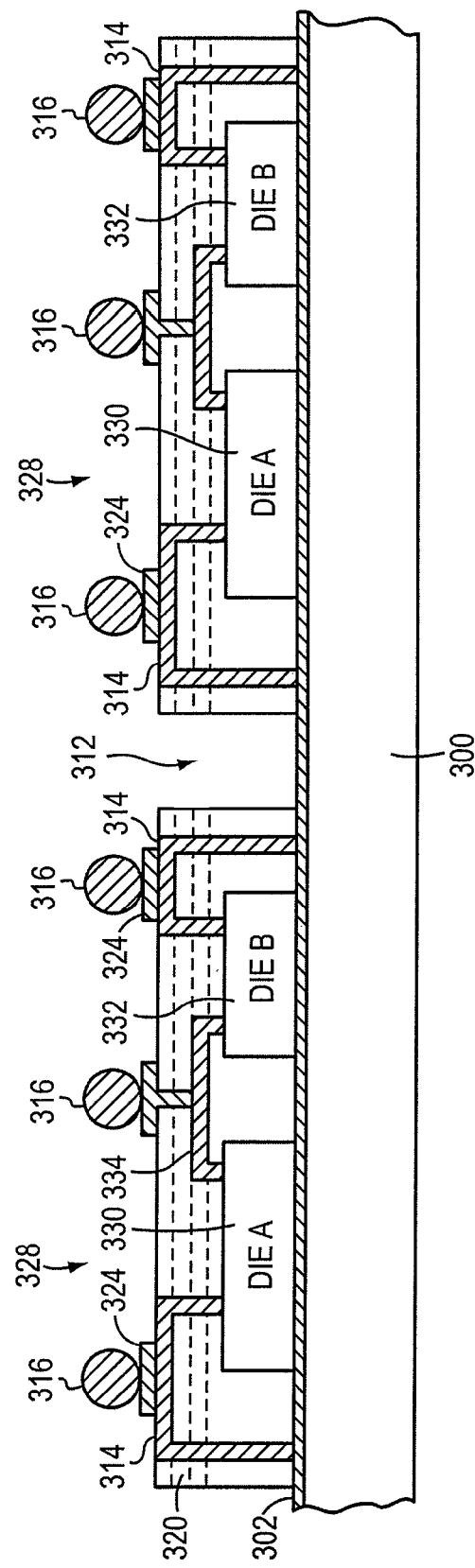
FIG. 23 is a cross-sectional diagram of a portion of one example of a semiconductor wafer including shielded modules.

According to another embodiment, a semiconductor wafer may be formed into a plurality of chips that comprise modules rather than individual dies. Referring to FIG. 23, there is illustrated a portion of one example of such a wafer. As discussed above, a plurality of dies may be attached to a plated substrate 300 at predetermined spacing. However, in this embodiment, each module 328, which is separated from other modules by a street 312 (along which the wafer will be singulated), may comprise two or more individual dies. In the example illustrated in FIG. 23, each module 328 comprises a first die 330 and a second die 332. These dies 330, 332 may be different components that operate together to provide a desired function. For example, one die may be an amplifier and another a filter such that the module provides an amplified signal within a desired frequency band.

As discussed above, layers of polymer (e.g., SU8) and metallization may be deposited over the dies 330, 332 to provide electrical contacts 324 to the dies 330, 332, to which solder balls 316 of a BGA may be attached. In one embodiment, additional layers of SU8 and metal may be required (compared to embodiments in which each chip comprises only a single die) to provide interconnections 334 between the two die 330, 332 within the module 328. In one example, a contact to the interconnection 334 may also be supplied such that a solder ball 316 of the BGA may be attached thereto, as illustrated in FIG. 23. As discussed above, at least one of the metal layers may substantially surround the module 328 and be coupled to the metal layer 302 on the substrate 300 so as to provide a faraday cage 314 that protects the module from electromagnetic interference. Thus, an electromagnetic shield (faraday cage) may be built in to process of packaging a module 328 that contains two or more die in the same manner as was discussed above for chips comprising one die.

In summary, at least some aspects and embodiments of the invention are directed to a semiconductor device, and packaging process for the same, that is small, robust and achieves good RF performance over a broad frequency range. In at least one embodiment, a packaged semiconductor chip may be a flip chip BGA device that includes one or more dies coated with at least one SU8 (or other polymer) layer and having a metal layer disposed over the SU8 layer to provide contacts and interconnects. The metal layer may also be configured to form a Faraday cage, at least partially surrounding the dies), to provide built-in electromagnetic shielding for individual dies or for modules comprising two or more dies. A process for fabricating such a semiconductor chip has also been described.

Having thus described several aspects of at least one embodiment, it is to be appreciated various alterations, modifications, and improvements will readily occur to those skilled in the art. These alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of packaging a semiconductor die, the method comprising:
adhering the die to a substrate in a flip chip configuration;
coating the die with a first polymer layer;
selectively removing the first polymer layer to provide at least one opening to expose a portion of the die; and
depositing a first metal layer over the first polymer layer, the first metal layer at least partially filling the at least one opening to provide an electrical contact to the die and including a portion that surrounds the die in a plane of an upper surface of the first metal layer to provide an electromagnetic shield around the die.

2. The method of claim 1 further comprising attaching a solder bump to the electrical contact.

3. The method of claim 1 further comprising:
depositing a second polymer layer over the first metal layer; and
selectively removing the second polymer layer to provide an opening over the electrical contact and allow access to the electrical contact.

4. The method of claim 3 further comprising depositing a second metal layer over the second polymer layer, the second metal layer being electrically connected to the first metal layer via the electrical contact.

5. The method of claim 4 further comprising:
depositing a third polymer layer over the second metal layer, the third polymer layer comprising an optically opaque additive; and
selectively removing the third polymer layer to provide access to the second metal layer.

6. The method of claim 4 further comprising electrically connecting the second metal layer to ground contacts on the substrate.

7. The method of claim 1 wherein depositing the first metal layer includes depositing a gold layer.

8. The method of claim 1 further comprising prior to adhering the die to the substrate, plating the substrate with a metal plating layer.

9. The method of claim 8 wherein plating the substrate includes plating the substrate with a titanium plating layer.

10. The method of claim 9 wherein plating the substrate further includes covering the titanium plating layer with a gold plating layer.

11. The method of claim 1 further comprising prior to adhering the die to the substrate, marking the substrate with alignment marks to guide placement of the die on the substrate.

12. The method of claim 1 wherein adhering the die to the substrate includes adhering the die using one of an epoxy and a solder process.

* * * * *